United States Patent [19]

Parent et al.

[11] Patent Number: 4,750,932
[45] Date of Patent: Jun. 14, 1988

[54] REFRACTORY METAL SILICIDE SPUTTERING TARGET

[75] Inventors: Edward D. Parent, Hamilton; Charles S. Purinton, Byfield, both of Mass.; Charles W. Sutter, Spanaway, Wash.

[73] Assignee: GTE Products Corporation, Stamford, Conn.

[21] Appl. No.: 88,620

[22] Filed: Dec. 18, 1986

Related U.S. Application Data

[62] Division of Ser. No. 723,221, Apr. 15, 1985, Pat. No. 4,663,120.

[51] Int. Cl.$^4$ ................................................ B22F 1/00
[52] U.S. Cl. ...................................... 75/228; 204/292; 204/293; 419/10; 419/33; 419/45; 419/48; 419/60; 501/96

[58] Field of Search .............. 419/10; 75/228; 419/33, 419/45, 48, 60; 501/96; 204/292, 293

[56] References Cited

U.S. PATENT DOCUMENTS

| | | | |
|---|---|---|---|
| 4,135,286 | 1/1979 | Wright et al. | 419/8 |
| 4,619,695 | 10/1986 | Oikawa et al. | 419/28 |
| 4,619,697 | 10/1986 | Hijikata et al. | 419/10 |
| 4,620,872 | 11/1986 | Hijikata et al. | 75/246 |
| 4,663,120 | 5/1987 | Parent et al. | 419/10 |

*Primary Examiner*—Stephen J. Lechert, Jr.
*Attorney, Agent, or Firm*—James Theodosopoulos

[57] ABSTRACT

A refractory metal silicide sputtering target is made by reacting refractory metal and silicon to about 70 to 90% completion of the reaction, comminuting the material, and then vacuum hot pressing the comminuted material to a high density compact.

4 Claims, No Drawings

REFRACTORY METAL SILICIDE SPUTTERING TARGET

This application is a division of application Ser. No. 723,221, filed 4/15/85, now U.S. Pat. No. 4,663,120.

This invention concerns refractory metal silicides. Thin films or layers of such silicides are useful in integrated circuits and semiconductor devices, as disclosed in U.S. Pat. Nos. 3,498,832, 4,180,596 and 4,407,933, where the silicide layer is formed by co-evaporating the refractory metal and the silicon, with a subsequent reaction to form the silicide.

Lately, the silicide layer has been directly deposited by vacuum sputtering from a target made of the desired refractory metal silicide. Sputtering is disclosed in U.S. Pat. Nos. 3,616,450, 3,669,860, 3,711,398, 3,878,085, 3,895,602, 4,041,353 and 4,060,470. This invention is particularly concerned with refractory metal silicides for use in sputtering targets.

In the past, such targets have been made by comminuting the refractory metal silicide and then hot pressing the comminuted powder into a dense compact. It has not been feasible to attain a high density compact having satisfactory high purity with such methods. This invention discloses a method for attaining such a high density compact, better than 95% theoretical density.

In this invention, elemental refractory metal and silicon are mixed and are then reacted to about 70 to 90% completion, hereafter referred to as the alloying reaction. That is to say, the reaction product comprises 70 to 90% refractory metal silicide, the balance being unreacted metal and silicon. The reaction product is then comminuted and then vacuum hot pressed under conditions that will complete the reaction and yield a high density product, better than, say, 95% theoretical density. The use of vacuum helps attain the desired purity for the target.

In a specific example, tantalum powder and silicon powder were mixed in a molar ratio of 1 to 2 which is the molar ratio for tantalum disilicide, $TaSi_2$. The powders were wet roller milled with methanol and alumina milling media, separated and dried. The mixture was then hot pressed at 100 psi in an inert atmosphere at about 950° C. for 30 minutes. The resultant partially reacted cake comprised 70 to 90% $TaSi_2$, the balance being Ta and Si. The cake was then crushed and mortar ground to less than 60 mesh and then roller milled with tantalum millig media for 8 hours. The resultant powder was then hot vacuum pressed into a high density compact at 1250° C. and 850 psi for 2 hours. This final hot pressing completed the reaction of the Ta and Si into $TaSi_2$, and achieved better than 95% theoretical density. This high density compact was then diamond machined into a sputtering target shape.

It is sometimes desirable to incorporate elemental silicon in the tantalum silicide target, as pointed out in "Refractory Metals Silicides," D. R. McLachlan and J. B. Avins, Semiconductor International, October 1984, pages 129-138. This is accomplished by adding and milling silicon powder into the $TaSi_2$ powder after the alloyed $TaSi_2$ has been roller milled with tantalum milling media, but before hot pressing. Satisfactory targets within the scope of this invention can be obtained by adding sufficient such silicon powder so that the ratio of Si to $TaSi_2$ in the finished target can be between 0:1 to 1.5:1. In one such example where the molar ratio of Si to $TaSi_2$ was 0.8 to 1 and the alloying reaction conditions were 1000° C. for 80 minutes, the compact had a theoretical density of 98.6%. In another example where the molar ratio of Si to $TaSi_2$ was 0.7 to 1 and the alloying conditions were 1000° C. for 60 minutes, the compact had a theoretical density of 99.6%. For fifteen such targets where the molar ratio of Si to $TaSi_2$ was 0.75 to 1, the average theoretical density was over 99.5%. For 14 such targets where the molar ratio of Si to $TaSi_2$ was 0.6 to 1, the theoretical densities were all between 96.8 to 98.5%.

Other refractory metals that are within the scope of this invention are chromium, titanium, vanadium, niobium, tungsten and molybdenum.

If the alloying reaction goes beyond about 90% completion, it becomes difficult to achieve the desired density. Below about 70%, there is too much shrinkage of final hot pressing which can result in voids or cracks in the pressed compact.

A significant advantage to high density refractory metal silicide targets in accordance with this invention is that they can be operated at substantially higher deposition rates than prior art targets. In one case, deposition time was reduced from 85 seconds to 70 seconds, an 18% increase in deposition rate.

We claim:

1. A refractory metal silicide sputtering target made by alloying refractory metal and silicon to about 70 to 90% completion, comminuting the alloyed material, and then vacuum hot pressing the comminuted material to complete the reaction of the refractory metal and silicon to refractory metal silicide and achieve a theoretical density greater than about 95%.

2. The target of claim 1 where the refractory metal comprises chromium, titanium, vanadium, niobium, tungsten, tantalum or molybdenum.

3. A tantalum disilicide sputtering target made by mixing tantalum metal powder and silicon powder in the molar ratio of about 1 to 2, heating the powder mixture to a reaction temperature to achieve about 70 to 90% formation of tantalum silicide, comminuting the reacted material, vacuum hot pressing the comminuted material to complete the reaction of the tantalum and silicon and to form a high density compact, and shaping the compact into a sputtering target.

4. A tantalum disilicide sputtering target made by mixing tantalum metal powder and silicon powder, heating the powder mixture to a reaction temperature to achieve about 70 to 90% formation of tantalum silicide, comminuting the reacted material, adding silicon to the comminuted material, vacuum hot pressing the comminuted material to complete the reaction of the refractory metal and silicon and to form a high density compact, and shaping the compact into a sputtering target, wherein the molar ratio of Si to $TaSi_2$ in the target is between 0:1 and 1.5:1.

* * * * *